United States Patent
Lee et al.

(10) Patent No.: US 12,191,256 B2
(45) Date of Patent: Jan. 7, 2025

(54) DISPLAY DEVICE

(71) Applicant: Samsung Display Co., LTD., Yongin-si (KR)

(72) Inventors: Jung Wook Lee, Hwaseong-si (KR); Min Woo Kang, Seoul (KR); Yeong Ho Kim, Incheon (KR); Yong Jae Park, Hwaseong-si (KR); Min Jae Baek, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 657 days.

(21) Appl. No.: 17/385,332

(22) Filed: Jul. 26, 2021

(65) Prior Publication Data

US 2022/0158051 A1    May 19, 2022

(30) Foreign Application Priority Data

Nov. 18, 2020  (KR) .................. 10-2020-0154414

(51) Int. Cl.
| | |
|---|---|
| *H01L 23/535* | (2006.01) |
| *H01L 23/48* | (2006.01) |
| *H01L 23/522* | (2006.01) |
| *H01L 23/532* | (2006.01) |
| *H01L 25/075* | (2006.01) |

(Continued)

(52) U.S. Cl.
CPC .......... *H01L 23/535* (2013.01); *H01L 23/481* (2013.01); *H01L 23/5226* (2013.01); *H01L 23/5329* (2013.01); *H01L 23/53295* (2013.01); *H01L 25/0753* (2013.01); *H01L 33/52* (2013.01); *H01L 33/62* (2013.01)

(58) Field of Classification Search
None
See application file for complete search history.

(56) References Cited

U.S. PATENT DOCUMENTS

| | | | |
|---|---|---|---|
| 2012/0223312 A1* | 9/2012 | Chen | H01L 27/1248 257/E29.273 |
| 2018/0197484 A1* | 7/2018 | Moon | H10K 59/123 |
| 2019/0041915 A1* | 2/2019 | Park | H10K 77/111 |

FOREIGN PATENT DOCUMENTS

| | | |
|---|---|---|
| KR | 10-0543009 | 1/2006 |
| KR | 10-2014-0141373 | 12/2014 |
| KR | 10-2016-0082669 | 7/2016 |

(Continued)

*Primary Examiner* — Feifei Yeung Lopez
(74) *Attorney, Agent, or Firm* — KILE PARK REED & HOUTTEMAN PLLC

(57) ABSTRACT

A display device includes a display panel including a display area and a non-display area; a first signal line in the non-display area and transmitting an initialization voltage; a connection wire in the non-display area and electrically connected to the first signal line; a bridge pattern connecting the first signal line to the connection wire; an insulating layer between the first signal line and the bridge pattern; a partition wall on the bridge pattern; and a spacer on the partition wall, wherein the insulating layer includes a first contact hole overlapping the first signal line, and a second contact hole overlapping the connection wire, the first signal line is connected to the bridge pattern through the first contact hole, the bridge pattern is connected to the connection wire through the second contact hole, the partition wall covers the first contact hole, and the spacer overlaps the first contact hole.

21 Claims, 18 Drawing Sheets

(51) Int. Cl.
   *H01L 33/52* (2010.01)
   *H01L 33/62* (2010.01)

(56) References Cited

FOREIGN PATENT DOCUMENTS

| KR | 10-2020-0004475 | 1/2020 |
| KR | 10-2100880 | 4/2020 |

\* cited by examiner

DISPLAY DEVICE

CROSS-REFERENCE TO RELATED APPLICATION(S)

This application claims priority to and benefits of Korean Patent Application No. 10-2020-0154414 under 35 U.S.C. § 119 filed on Nov. 18, 2020 in the Korean Intellectual Property Office, the entire contents of which are incorporated herein by reference.

BACKGROUND

1. Technical Field

The disclosure relates to a display device.

2. Description of the Related Art

A display device such as an emissive display device may include a display panel on which a screen for displaying images is positioned. The display panel may be manufactured by forming layers and elements on a substrate.

The above information disclosed in this background section is only for enhancement of understanding of the background of the disclosure, and therefore it may contain information that does not form the prior art that may already be known to a person of ordinary skill in the art.

SUMMARY

The disclosure provides a display device for preventing a generation of defects such as a short circuit or a burnt area.

An embodiment provides a display device that may include a display panel including a display area and a non-display area; a first signal line disposed in the non-display area and transmitting an initialization voltage; a connection wire disposed in the non-display area and electrically connected to the first signal line; a bridge pattern electrically connecting the first signal line to the connection wire; an insulating layer disposed between the first signal line and the bridge pattern; a partition wall disposed on the bridge pattern; and a spacer disposed on the partition wall, wherein the insulating layer may include a first contact hole overlapping the first signal line; and a second contact hole overlapping the connection wire, the first signal line is electrically connected to the bridge pattern through the first contact hole, the bridge pattern is electrically connected to the connection wire through the second contact hole, the partition wall covers the first contact hole, and the spacer overlaps the first contact hole.

The partition wall may fill the first contact hole and the second contact hole.

The partition wall may include a first denting portion overlapping the first contact hole, and a second denting portion overlapping the second contact hole.

The spacer may fill the first denting portion and the second denting portion of the partition wall.

The partition wall and the spacer may be disposed on a same layer and may include a same material, and the spacer may protrude from the partition wall.

The spacer may include a first spacer surrounding an edge of the bridge pattern; a second spacer overlapping the first contact hole; and a third spacer overlapping the second contact hole.

The spacer may further include a fourth spacer disposed on the bridge pattern and not overlapping the first contact hole and the second contact hole.

The second spacer may be spaced apart from the first spacer.

The second spacer may be connected to the first spacer.

The third spacer may be spaced apart from the first spacer.

The third spacer may be connected to the first spacer.

The display panel may include a buffer layer, a first gate insulating layer, a second gate insulating layer, a first insulating layer, a third gate insulating layer, a second insulating layer, a third insulating layer, a fourth insulating layer, and the partition wall sequentially disposed on a substrate, and the first signal line and the connection wire may be disposed between the third insulating layer and the fourth insulating layer.

The bridge pattern may be disposed between the fourth insulating layer and the partition wall.

The spacer may be disposed on the partition wall, and the display device may further include a conductive layer disposed on the spacer.

A height of the spacer may be equal to or greater than about 10,000 angstroms (Å).

An embodiment provides a display device that may include a display panel including a display area and a non-display area; a first signal line disposed in the non-display area and transmitting a first signal; a connection wire electrically connected to the first signal line; a bridge pattern disposed in the non-display area and electrically connecting the first signal line and the connection wire; an insulating layer disposed between the first signal line and the bridge pattern; and a spacer disposed on the partition wall, wherein the insulating layer includes a first contact hole overlapping the first signal line; and a second contact hole overlapping the connection wire, the first signal line is electrically connected to the bridge pattern through the first contact hole, the bridge pattern is electrically connected to the connection wire through the second contact hole, the partition wall includes a denting portion overlapping the first contact hole and the second contact hole, and the spacer fills the denting portion.

The first signal line may transmit a first initialization voltage or a second initialization voltage.

The bridge pattern may include at least an opening in the bridge pattern.

The connection wire may extend in a first direction, the first signal line may extend in a second direction, and the first direction and the second direction may be substantially perpendicular to each other.

The spacer may include a first spacer surrounding an edge of the bridge pattern, a second spacer overlapping the first contact hole, and a third spacer overlapping the second contact hole.

The spacer may further include a fourth spacer disposed on the bridge pattern and not overlapping the first contact hole and the second contact hole.

According to the embodiments, a generation of defects such as a short circuit or a burnt area around the peripheral area of the display device may be prevented.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
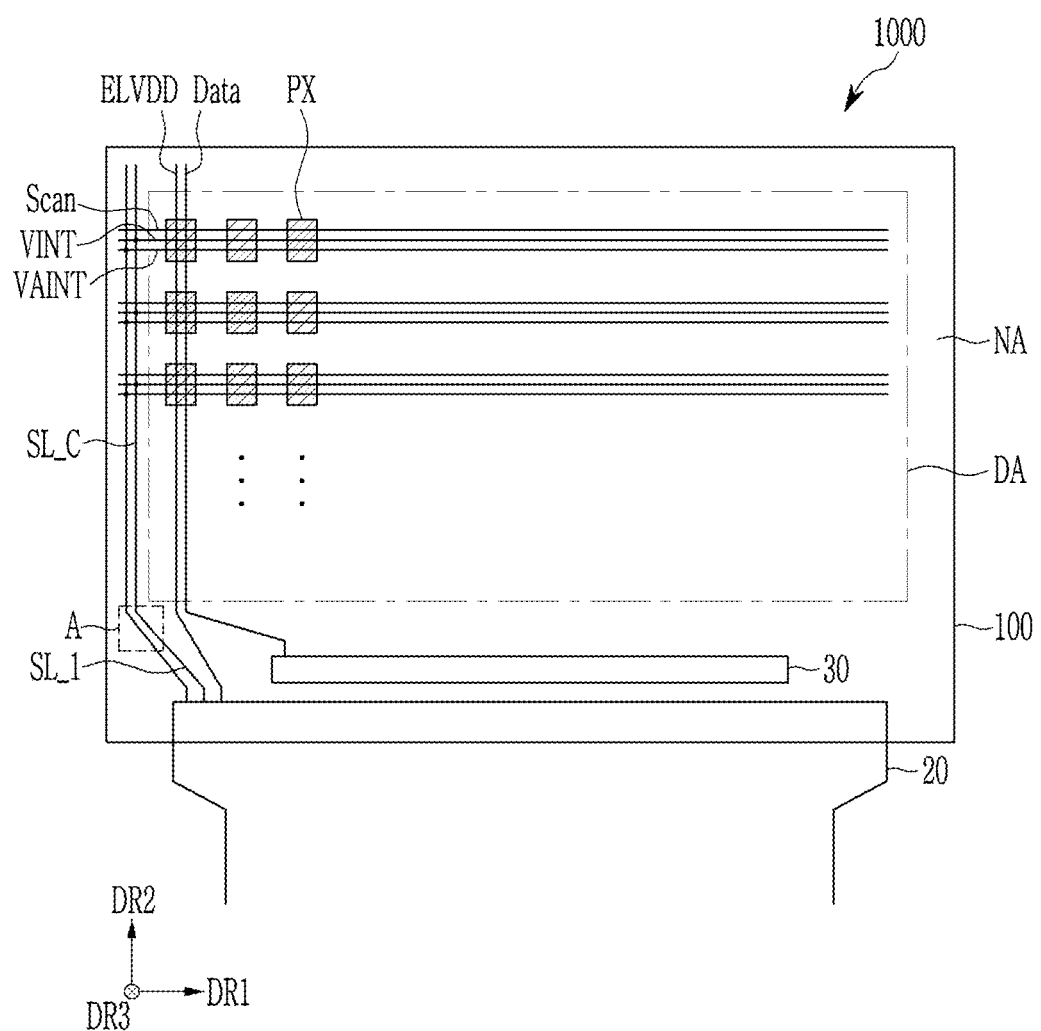
FIG. 1 shows a schematic top plan view of a display device according to an embodiment.

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

Parts that may be irrelevant to the description will be omitted to clearly describe the disclosure, and the same elements will be designated by the same reference numerals throughout the specification.

The size and thickness of each configuration shown in the drawings are arbitrarily shown for better understanding and ease of description, but the disclosure is not limited thereto. In the drawings, the thickness of layers, films, panels, regions, etc., are exaggerated for clarity. The thicknesses of some layers and areas are exaggerated for convenience of explanation.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

For example, the spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

Unless explicitly described to the contrary, the terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing an object portion from the top, and the phrase "in a cross-sectional view" means viewing a cross-section of which the object portion is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
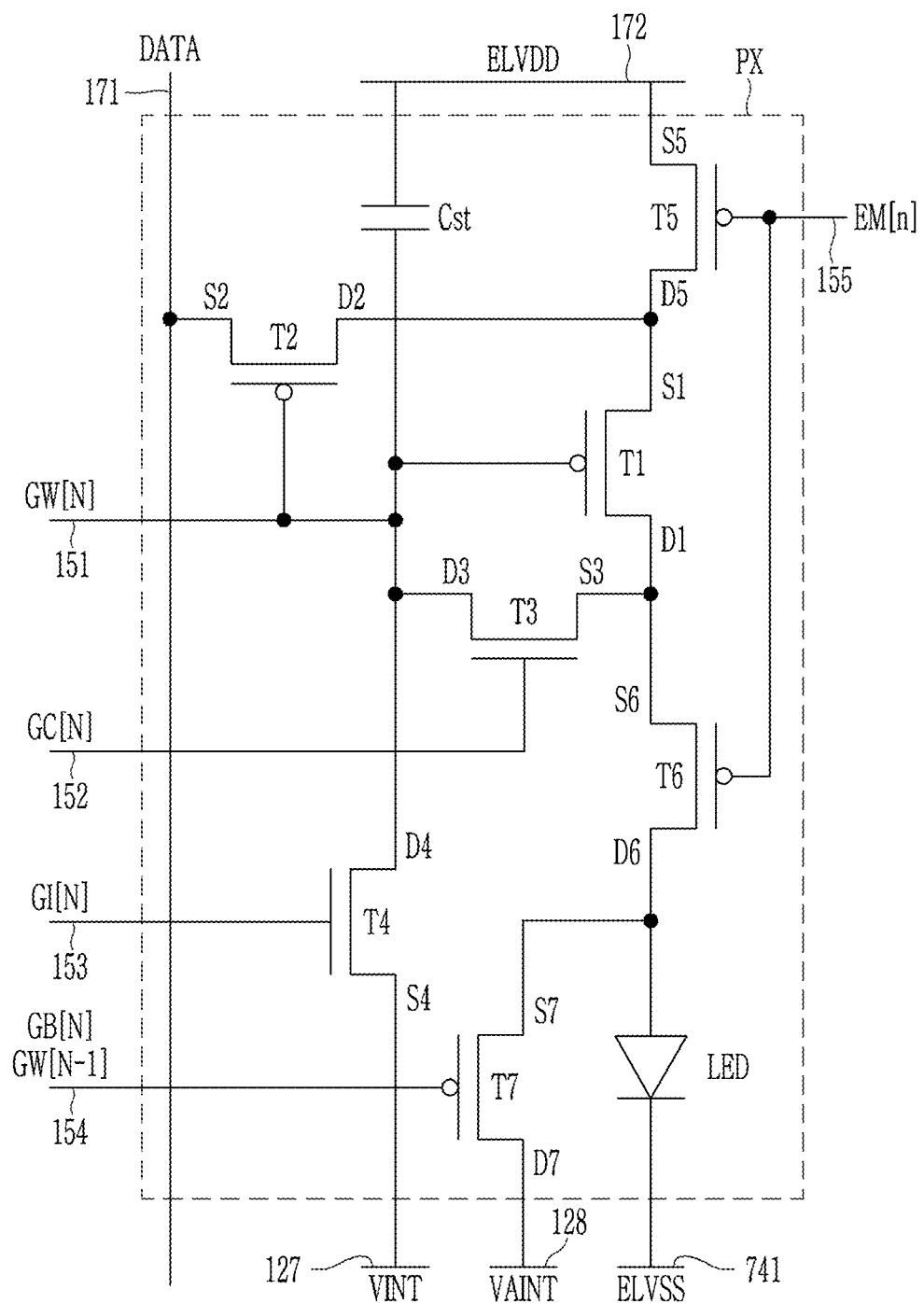
FIG. 2 shows a schematic diagram of an equivalent circuit of a pixel positioned in a display area.
Figure 3:
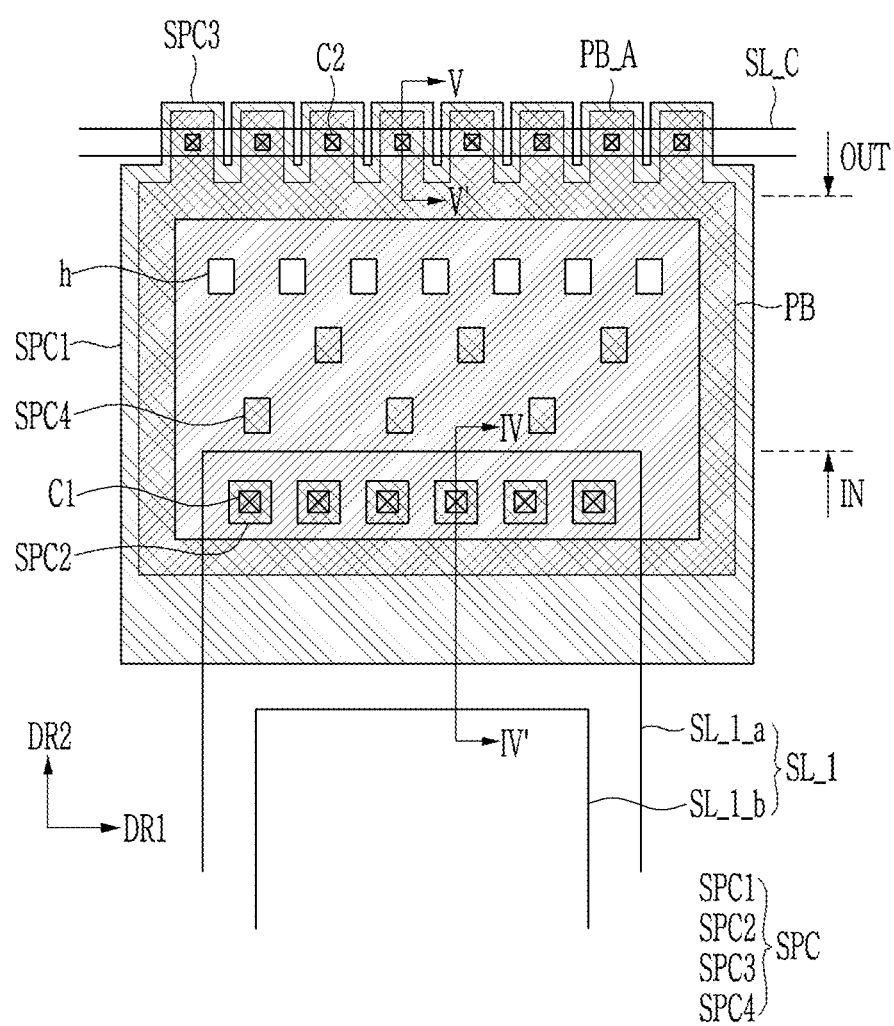
FIG. 3 shows a schematic top plan view of a region A of one signal line according to an embodiment.
Figure 4A:
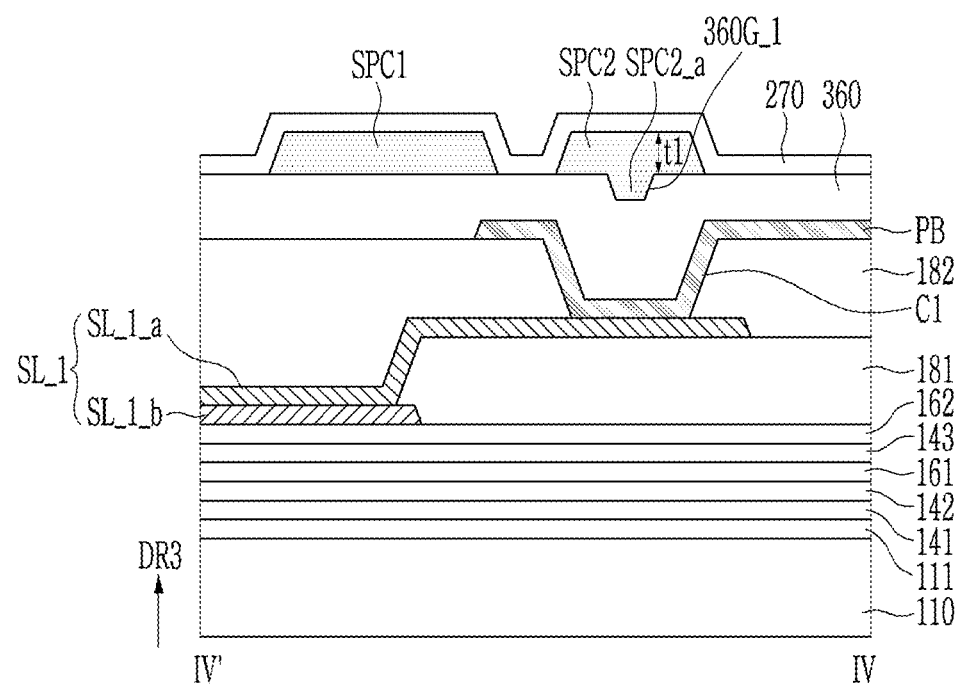
FIG. 4A shows a schematic cross-sectional view with respect to line IV-IV' of FIG. 3.
Figure 4B:
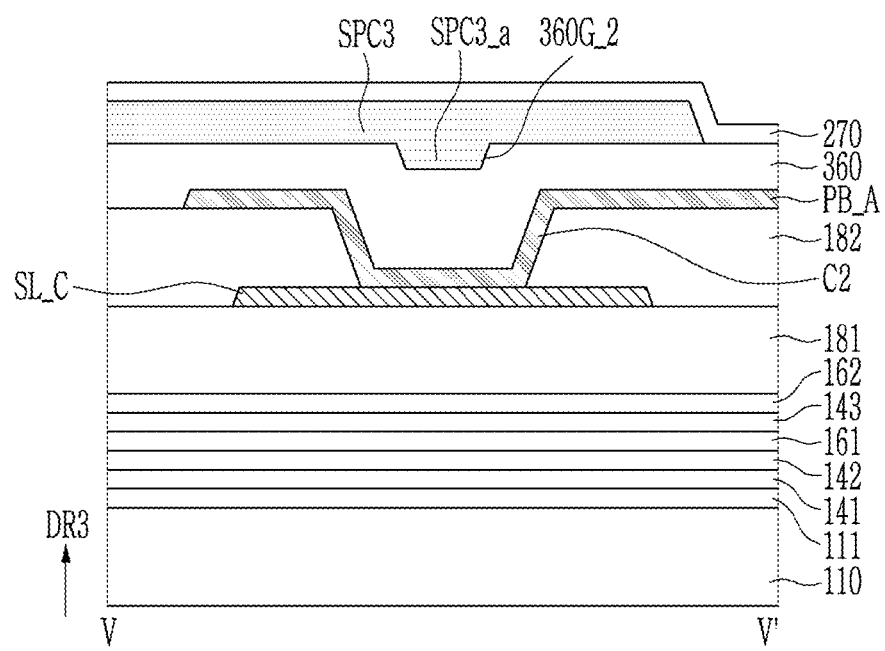
FIG. 4B shows a schematic cross-sectional view with respect to line V-V' of FIG. 3.

A display device according to an embodiment will now be described with reference to FIGS. 1 to 4B. FIG. 1 illustrates a schematic top plan view of a display device according to an embodiment, FIG. 2 illustrates a schematic diagram of an equivalent circuit of a pixel positioned in a display area, FIG. 3 illustrates a schematic top plan view of region A of a signal line according to an embodiment, FIG. 4A illustrates a schematic cross-sectional view taken along line IV-IV' of FIG. 3, and FIG. 4B illustrates a schematic cross-sectional view taken along line V-V' of FIG. 3.

Referring to FIG. 1, a display device 1000 may include a driving part including a display panel 100, a flexible printed circuit film 20 bonded to the display panel 100, and an integrated circuit chip 30.

The display panel 100 may include a display area DA corresponding to a screen for displaying images and a non-display area NA in which circuits and/or signal lines for generating and/or transmitting various signals to be applied to the display area DA are disposed. The non-display area NA may surround or may be adjacent to the display area DA.

Pixels PX may be disposed in a matrix in the display area DA of the display panel 100. Signal lines such as a scan line Scan, a data line Data, a driving voltage line ELVDD, or initialization voltage lines VINT and VAINT may be disposed in the display area DA. The scan line Scan may substantially extend in a first direction DR1, and the data line Data and the driving voltage line ELVDD may substantially extend in a second direction DR2. The first direction DR1 and the second direction DR2 may be substantially orthogonal or substantially perpendicular to each other. A third direction DR3 may be substantially perpendicular to the first direction DR1 and the second direction DR2 and may be considered as a thickness direction. The initialization voltage lines VINT and VAINT may substantially extend in the first direction DR1, but the disclosure is not limited thereto. For example, the initialization voltage lines VINT and VAINT may substantially extend in the second direction DR2, or may include a voltage line extending in the first direction DR1 and a voltage line extending in the second direction DR2, and may be disposed in mesh form. The respective pixels PX may be electrically connected to the scan line Scan, the data line Data, the driving voltage line ELVDD, and the initialization voltage lines VINT and VAINT and may receive a scan signal, a data signal, a driving voltage, and an initialization voltage from the signal lines. The respective pixels PX may also receive a common voltage. The pixel PX may be implemented as a light-emitting element such as a light-emitting diode LED.

A touch sensor for sensing a user's contact and/or non-contact touch may be disposed in the display area DA.

A driving part for generating and/or processing various signals for driving the display panel 100 may be positioned in the non-display area NA of the display panel 100. The driving part may include a data driver for applying a data signal to data lines, a scan driver for applying a scan signal to scan lines, and a signal controller for controlling the data driver and the scan driver. The pixels PX may receive a data signal at a time in response to the scan signal generated by the scan driver. The scan driver may be integrated on the display panel 100 and may be positioned on at least one side or a side of the display area DA. The data driver and the signal controller may be provided as an integrated circuit chip 30 (also referred to as a driving IC chip), and the integrated circuit chip 30 may be mounted in the non-display area NA of the display panel 100. The integrated circuit chip 30 may be mounted on the flexible printed circuit film 20 or the like and may be electrically connected to the display panel 100.

According to an embodiment, a first signal line SL_1 for transmitting one of the above-noted signals, and a connection wire SL_C for electrically connecting the signal lines VINT and VAINT, electrically connected to the pixel PX, to the first signal line SL_1, may be positioned in the non-display area NA.

The first signal line SL_1 and the connection wire SL_C may be positioned on a same layer or different layers. The first signal line SL_1 and the connection wire SL_C may be electrically connected to each other through a bridge pattern positioned in region A according to a design structure of the non-display area NA, which will be described below with reference to FIG. 3.

The first signal line SL_1 and the connection wire SL_C may be illustrated as a single line in the specification, which does not illustrate a signal line that is continuously formed, and which may illustrate that the first signal line SL_1 and the connection wire SL_C are electrically connected to each other and transmit a signal.

A diagram of an equivalent circuit of a pixel PX positioned in the display area DA will now be described with reference to FIG. 2.

As shown in FIG. 2, a pixel PX of the display device according to an embodiment may include transistors T1, T2, T3, T4, T5, T6, and T7, for example first to seventh transistors T1, T2, T3, T4, T5, T6, and T7, electrically connected to wires 127, 128, 151, 152, 153, 154, 155, 171, 172, and 741, a storage capacitor Cst, and a light-emitting diode LED.

The wires 127, 128, 151, 152, 153, 154, 155, 171, 172, and 741 may be electrically connected to a pixel PX. The wires 127, 128, 151, 152, 153, 154, 155, 171, 172, and 741 may include a first initialization voltage line 127, a second initialization voltage line 128, a first scan line 151, a second scan line 152, an initialization control line 153, a bypass control line 154, a light emitting control line 155, a data line 171, a driving voltage line 172, and a common voltage line 741.

The first scan line 151 may be electrically connected to a gate driver (not shown) and may transmit a first scan signal GW[N] to the second transistor T2. A voltage with opposite polarity to the voltage applied to the first scan line 151 may be applied to the second scan line 152 at a same time as a signal from the first scan line 151. For example, in case that a voltage with negative polarity is applied to the first scan line 151, a voltage with positive polarity may be applied to the second scan line 152. The second scan line 152 may transmit a second scan signal GC[N] to the third transistor T3.

The initialization control line 153 may transmit an initialization control signal GI[N] to the fourth transistor T4. The bypass control line 154 may transmit a bypass signal GB[N] to the seventh transistor T7. The bypass control line 154 may be formed as a previous-stage first scan line, GW[N−1] 151. The light emitting control line 155 may transmit an emission control signal EM[n] to the fifth transistor T5 and the sixth transistor T6.

The data line 171 may transmit a data voltage DATA generated by a data driver (not shown), and luminance of light emitted by the light-emitting diode LED may be changed according to the data voltage DATA applied to the pixel PX.

The driving voltage line 172 may apply the driving voltage ELVDD. The first initialization voltage line 127 may transmit a first initialization voltage VINT, and the second initialization voltage line 128 may transmit a second initialization voltage VAINT. The common voltage line 741 may apply a common voltage ELVSS to a cathode of the light-emitting diode LED. In an embodiment, the voltages applied to the driving voltage line 172, the first and second initialization voltage lines 127 and 128, and the common voltage line 741 may be constant.

A structure of transistors and a connection relationship thereof will now be described in detail.

The driving transistor T1 may have a p-type transistor characteristic and may include a polycrystalline semiconductor. The driving transistor T1 may control a current to be output to an anode of the light-emitting diode LED according to the data voltage DATA applied to a gate electrode of the driving transistor T1. The brightness of the light-emitting diode LED may be controlled according to a driving current output to the anode of the light-emitting diode LED, and thus the luminance of the light-emitting diode LED may be controlled according to the data voltage DATA applied to the pixel PX. For this purpose, a first electrode S1 of the driving transistor T1 may receive a driving voltage ELVDD and may be electrically connected to the driving voltage line 172 through the fifth transistor T5. The first electrode S1 of the driving transistor T1 may be electrically connected to a second electrode D2 of the second transistor T2 to receive the data voltage DATA. A second electrode D1 of the driving transistor T1 may output a current to the light-emitting diode LED and may be electrically connected to the anode of the light-emitting diode LED through the sixth transistor T6. The second electrode D1 of the driving transistor T1 may transmit the data voltage DATA, applied to the first electrode S1, to the third transistor T3. The gate electrode of the driving transistor T1 may be electrically connected to an electrode (hereinafter referred to as a second storage electrode) of the storage capacitor Cst. A voltage at the gate electrode of the driving transistor T1 may change according to a voltage stored in the storage capacitor Cst, and thus a driving current output by the driving transistor T1 may change. The storage capacitor Cst may also maintain the voltage at the gate electrode of the driving transistor T1 for a frame.

The second transistor T2 may have a p-type transistor characteristic and may include a polycrystalline semiconductor. The second transistor T2 may receive the data voltage DATA into the pixel PX. A gate electrode of the second transistor T2 may be electrically connected to the first scan line 151. A first electrode S2 of the second transistor T2 may be electrically connected to the data line 171. The second electrode D2 of the second transistor T2 may be electrically connected to the first electrode S1 of the driving transistor T1. In case that the second transistor T2 is turned on by a negative voltage of the first scan signal GW[N] transmitted through the first scan line 151, the data voltage DATA transmitted through the data line 171 may be transmitted to the first electrode S1 of the driving transistor T1.

The third transistor T3 may have an n-type transistor characteristic and may include an oxide semiconductor. The third transistor T3 may electrically connect the second electrode D1 of the driving transistor T1 to the gate electrode of the driving transistor T1. The third transistor T3 resultantly may transmit the compensation voltage, which is changed in case that the data voltage DATA passes through the driving transistor T1, to the second storage electrode of the storage capacitor Cst. A gate electrode of the third transistor T3 may be electrically connected to the second scan line 152, and a first electrode S3 of the third transistor T3 may be electrically connected to the second electrode D1 of the driving transistor T1. A second electrode D3 of the third transistor T3 may be electrically connected to the second storage electrode of the storage capacitor Cst and the gate electrode of the driving transistor T1. The third transistor T3 may be turned on by a positive voltage of the second scan signal GC[N] received through the second scan line 152 to electrically connect the gate electrode of the driving transistor T1 to the second electrode D1 of the driving transistor T1 and to transmit the voltage, applied to the gate electrode of the driving transistor T1, to the second storage electrode of the storage capacitor Cst to store the voltage in the storage capacitor Cst.

The fourth transistor T4 may have an n-type transistor characteristic and may include an oxide semiconductor. The fourth transistor T4 may initialize the gate electrode of the driving transistor T1 and the second storage electrode of the storage capacitor Cst. A gate electrode of the fourth transistor T4 may be electrically connected to the initialization control line 153, and a first electrode S4 of the fourth transistor T4 may be electrically connected to the first initialization voltage line 127. A second electrode D4 of the fourth transistor T4 may pass through the second electrode D3 of the third transistor T3 and may be electrically connected to the second storage electrode of the storage capacitor Cst and the gate electrode of the driving transistor T1. The fourth transistor T4 may be turned on by a positive voltage of the initialization control signal GI[N] received through the initialization control line 153 to transmit the first initialization voltage VINT to the gate electrode of the driving transistor T1 and the second storage electrode of the storage capacitor Cst. Therefore, the voltage at the gate electrode of the driving transistor T1 and the storage capacitor Cst may be initialized.

The fifth transistor T5 may have a p-type transistor characteristic and may include a polycrystalline semiconductor. The fifth transistor T5 may transmit the driving voltage ELVDD to the driving transistor T1. A gate electrode of the fifth transistor T5 may be electrically connected to the emission control line 155, a first electrode S5 of the fifth transistor T5 may be electrically connected to the driving voltage line 172, and a second electrode D5 of the fifth transistor T5 may be electrically connected to the first electrode S1 of the driving transistor T1.

The sixth transistor T6 may have a p-type transistor characteristic and may include a polycrystalline semiconductor. The sixth transistor T6 may transmit the driving current, output by the driving transistor T1, to the light-emitting diode LED. A gate electrode of the sixth transistor T6 may be electrically connected to the emission control line 155, a first electrode S6 of the sixth transistor T6 may be electrically connected to the second electrode D1 of the driving transistor T1, and a second electrode D6 of the sixth transistor T6 may be electrically connected to the anode of the light-emitting diode LED.

The seventh transistor T7 may have a p-type transistor characteristic and may include a polycrystalline semiconductor. The seventh transistor T7 may initialize the anode of the light-emitting diode LED. A gate electrode of the seventh transistor T7 may be electrically connected to the bypass control line 154, a first electrode S7 of the seventh transistor T7 may be electrically connected to the anode of the light-emitting diode LED, and a second electrode D7 of the seventh transistor T7 may be electrically connected to the second initialization voltage line 128. In case that the seventh transistor T7 is turned on by a negative voltage of the bypass signal GB[N], the second initialization voltage VAINT may be applied to the anode of the light-emitting diode LED, and thus the anode may be initialized.

It has been described in the above that a pixel PX includes seven transistors T1 to T7 and a storage capacitor Cst, but the disclosure is not limited thereto, and the numbers of transistors and capacitors and their connection relationship may be modifiable in various ways.

In an embodiment, the driving transistor T1 may include a silicon semiconductor. The third transistor T3 and the fourth transistor T4 may include oxide semiconductors. The second transistor T2, the fifth transistor T5, the sixth transistor T6, and the seventh transistor T7 may include silicon semiconductors. However, the disclosure is not limited thereto, and at least one of the second transistor T2, the fifth transistor T5, the sixth transistor T6, and the seventh transistor T7 may include an oxide semiconductor. In an embodiment, as the third transistor T3 and the fourth transistor T4 include semiconductor materials that are different from the driving transistor T1, they may be driven more stably, and reliability may be improved.

A structure of region A in which the first signal line SL_1 positioned or disposed in the non-display area NA is electrically connected to the connection wire SL_C so as to transmit a signal to the first initialization voltage line 127 for receiving the first initialization voltage VINT or the second initialization voltage line 128 for receiving the second initialization voltage VAINT, will now be described with reference to FIGS. 3 to 4B. The first signal line SL_1 shown in FIG. 3 may be, as an example, a signal line for transmitting the first initialization voltage VINT. However, the disclosure is not limited thereto, the first signal line SL_1 may be a signal line for transmitting the second initialization voltage VAINT or a signal line for transmitting a driving voltage or a power supply voltage.

FIG. 3 illustrates region A of FIG. 1 in which a bridge pattern PB, the first signal line SL_1, and the connection wire SL_C for transmitting signals are positioned in the non-display area NA. A region to which the signal is input is marked as an in-region IN, and a region to which the signal is transmitted is marked as an out-region OUT. FIG. 4A illustrates a schematic cross-sectional view of the in-region IN, and FIG. 4B illustrates a schematic cross-sectional view of the out-region OUT.

The in-region IN will now be described with reference to FIGS. 3 and 4A. Referring to FIGS. 3 and 4A, a buffer layer 111, a first gate insulating layer 141, a second gate insulating layer 142, a first insulating layer 161, a third gate insulating layer 143, a second insulating layer 162, a third insulating layer 181, and a fourth insulating layer 182 may be sequentially stacked each other on a substrate 110.

A first signal line SL_1, which transmits the first initialization voltage VINT and is positioned in the non-display area NA, may be positioned on the third insulating layer 181. The first signal line SL_1 may substantially extend in the second direction DR2 in a plan view. However, the disclosure is not limited thereto, and the first signal line SL_1 may extend in the first direction DR1.

The first signal line SL_1 may be multiple layers including a first layer SL_1_a and a second layer SL_1_b according to an embodiment. However, the disclosure is not limited thereto, and the first signal line SL_1 may be formed as a single layer. The first layer SL_1_a may be positioned on the third insulating layer 181, the second layer SL_1_b may be positioned on the second insulating layer 162, and the first layer SL_1_a may contact the second layer SL_1_b in a region from which the third insulating layer 181 is removed.

The fourth insulating layer 182 may be positioned on the first signal line SL_1. The fourth insulating layer 182 may include a first contact hole C1 for exposing a part of the first signal line SL_1. The fourth insulating layer 182 according to an embodiment may include multiple contact holes C1. The contact holes C1 may overlap the first signal line SL_1. The contact holes C1 may be sequentially disposed in the first direction DR1, but the disclosure is not limited thereto.

The bridge pattern PB may be positioned on the fourth insulating layer 182. The bridge pattern PB may have a substantially quadrangular shape in a plan view and may include a protrusion PB_A protruding in the second direction DR2. The protrusion PB_A may contact the connection wire SL_C electrically connected to the pixel PX positioned in the display area DA.

The bridge pattern PB may be electrically connected to the first signal line SL_1 through the contact holes C1 and may contact the first signal line SL_1.

The bridge pattern PB according to an embodiment may include holes h or openings. The holes or openings h may be randomly or irregularly formed in the bridge pattern PB in a plan view. Gas accumulated in the fourth insulating layer 182 or the like may be discharged through the holes h or openings.

A partition wall 360 and a spacer SPC may be positioned on the bridge pattern PB. The partition wall 360 may cover or overlap or may completely cover or overlap the bridge pattern PB and the fourth insulating layer 182.

According to an embodiment, the partition wall 360 overlapping a front side of the substrate 110 may have a step in the first contact hole C1 of the bridge pattern PB. The partition wall 360 may include a first denting portion 360G_1 overlapping the first contact hole C1. The partition wall 360 may include first denting portions 360G_1 corresponding to the number of the overlapping first contact holes C1.

The spacer SPC may be positioned on the partition wall 360. The spacer SPC according to an embodiment may include a first spacer SPC1 positioned along an edge of the bridge pattern PB, a second spacer SPC2 positioned in the first contact hole C1, and a third spacer SPC3 positioned in a second contact hole C2 to be described below. According to an embodiment, the spacer SPC may include a fourth spacer SPC4 randomly or irregularly disposed on the bridge pattern PB.

The first spacer SPC1 may have a quadrangular edge in a plan view. However, the disclosure is not limited thereto, and the shape of the first spacer SPC1 may be changed corresponding to the shape of the edge of the bridge pattern PB.

The second spacer SPC2 may have an island shape separated or distanced or spaced apart from the first spacer SPC1. As overlapping the first contact hole C1, the second spacer SPC2 may overlap the first denting portion 360G_1. For example, the second spacer SPC2 may include a substantially convex portion SPC2_a filling the first denting portion 360G_1. The second spacer SPC2 may fill the denting portion 360G_1 by the substantially convex portion SPC2_a and may provide a planar or flat upper side.

A height t1 of the second spacer SPC2 may be equal to or greater than about 10,000 angstroms (Å). In case that the height t1 of the second spacer SPC2 is less than 10,000 angstroms (Å), the first denting portion 360G_1 may not be stably filled, and thus a defect such as a burnt area or a short circuit may occur between a conductive layer 270 and the bridge pattern PB. The fourth spacer SPC4 may be positioned on the bridge pattern PB and may not overlap the first contact hole C1 and the second contact hole C2. The fourth spacer SPC4 may be separated or distanced or spaced apart from the first contact hole C1 and the second contact hole C2 in a plan view.

The conductive layer 270 may be positioned on the spacer SPC and the partition wall 360. The spacer SPC may fill the first denting portion 360G_1 caused by the first contact hole C1. Therefore, the conductive layer 270 positioned on the spacer SPC may be provided in stable form, and the spacer SPC may prevent defects that the conductive layer 270 is short circuited or burnt with the bridge pattern PB, which is another conductive layer.

The out-region OUT will now be described with reference to FIGS. 3 and 4B. Similar to what is described with reference to FIG. 4A, a buffer layer 111, a first gate insulating layer 141, a second gate insulating layer 142, a first insulating layer 161, a third gate insulating layer 143, a second insulating layer 162, and a third insulating layer 181 positioned on the substrate 110 may be stacked each other in the out-region OUT.

A connection wire SL_C electrically connected to the pixel PX positioned in the display area DA may be positioned on the third insulating layer 181. The connection wire SL_C may extend in the first direction DR1 in a plan view. However, the disclosure is not limited thereto, and the connection wire SL_C may extend in the second direction DR2 and may include a shape for electrically connecting to a signal line included in the pixel PX.

A fourth insulating layer 182 may be positioned on the connection wire SL_C. The fourth insulating layer 182 may include a second contact hole C2 for exposing a part of the connection wire SL_C. The fourth insulating layer 182 may include second contact holes C2, and for example, it may include second contact holes C2 arranged or disposed in the first direction DR1.

A bridge pattern PB may be positioned on the fourth insulating layer 182. For example, a protrusion PB_A of the bridge pattern PB may be positioned thereon. The bridge pattern PB may transmit, to the connection wire SL_C, the voltage (for example, the first initialization voltage VINT or the second initialization voltage VAINT) transmitted from the first signal line SL_1.

A partition wall 360 may be positioned on the bridge pattern PB. The partition wall 360 may include a second denting portion 360G_2 positioned in a region thereof overlapping the second contact hole C2.

A spacer SPC may be positioned on the partition wall 360. For example, the third spacer SPC3 may overlap the second denting portion 360G_2. The third spacer SPC3 may fill the second denting portion 360G_2. The third spacer SPC3 may include a substantially convex portion SPC3_a for filling the second denting portion 360G_2. The third spacer SPC3 may provide a planar or flat upper side.

A conductive layer 270 may be positioned on the spacer SPC. As described above, the spacer SPC according to an embodiment may fill the second denting portion 360G_2 caused by the second contact hole C2. Therefore, the conductive layer 270 positioned on the spacer SPC may be provided in stable form and the spacer SPC may prevent defects that the conductive layer 270 is short circuited or burnt with the bridge pattern PB, which is another conductive layer.

Figure 5A:
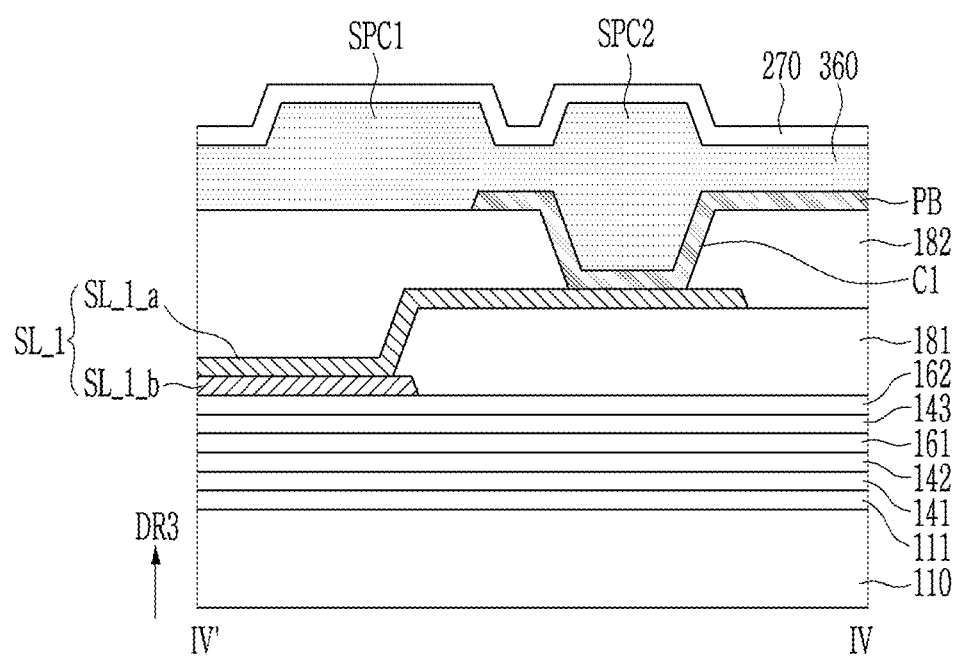
FIG. 5A shows a schematic cross-sectional view with respect to line IV-IV' of FIG. 3 according to an embodiment.
Figure 5B:
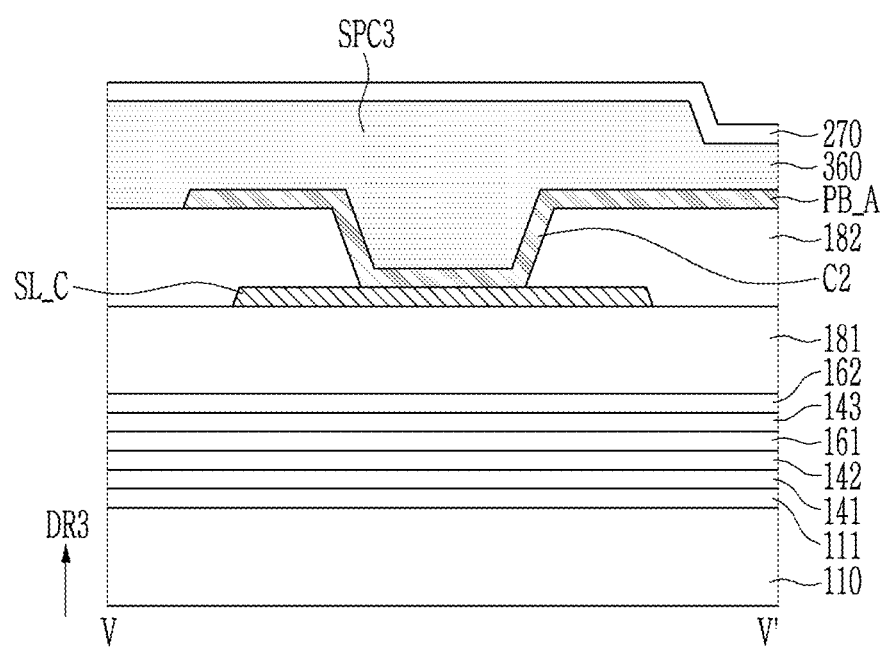
FIG. 5B shows a schematic cross-sectional view with respect to line V-V' of FIG. 3 according to an embodiment.

A display device according to an embodiment will now be described with reference to FIGS. 5A and 5B. FIG. 5A illustrates a schematic cross-sectional view taken along line IV-IV' of FIG. 3 according to an embodiment, and FIG. 5B illustrates a schematic cross-sectional view taken along line V-V' of FIG. 3 according to an embodiment. The same elements as those described with reference to FIG. 4A and FIG. 4B will be omitted.

The partition wall 360 and the spacer SPC described with reference to FIGS. 4A and 4B are illustrated as additional layers. However, the disclosure is not limited thereto. As shown in FIGS. 5A and 5B, the partition wall 360 and the spacer SPC may form a layer that is substantially not distinguished or separated. The partition wall 360 and the spacer SPC according to an embodiment may include a same material or similar material and may be formed by a same process. For example, the partition wall 360 may be formed by using a halftone region of a mask, and the spacer SPC may be formed by using a full tone region of a mask. The spacer SPC may protrude from the partition wall 360.

A first spacer SPC1 positioned on an edge of the bridge pattern PB, a second spacer SPC2 overlapping the first contact hole C1, and a third spacer SPC3 overlapping the second contact hole C2 may have substantially a same height of upper sides. The first spacer SPC1 may be positioned on the partition wall 360 overlapping the second insulating layer 182 having a planar or flat side. The second spacer SPC2 may be positioned on the partition wall 360 overlapping the first contact hole C1. The third spacer SPC3 may be positioned on the partition wall 360 overlapping the second contact hole C2. The partition wall 360 may fill the first contact hole C1 and the second contact hole C2, and the upper sides of the second spacer SPC2 and the third spacer SPC3 positioned thereon may have substantially flat or planar shapes.

Embodiments to be described below also illustrate the partition wall 360 and the spacer SPC as being separated layers, but this is for description purposes. The partition wall 360 and the spacer SPC may be formed by a same process to form a same layer according to a stacked structure thereof, and the spacer SPC may protrude from the partition wall 360.

Figure 6:
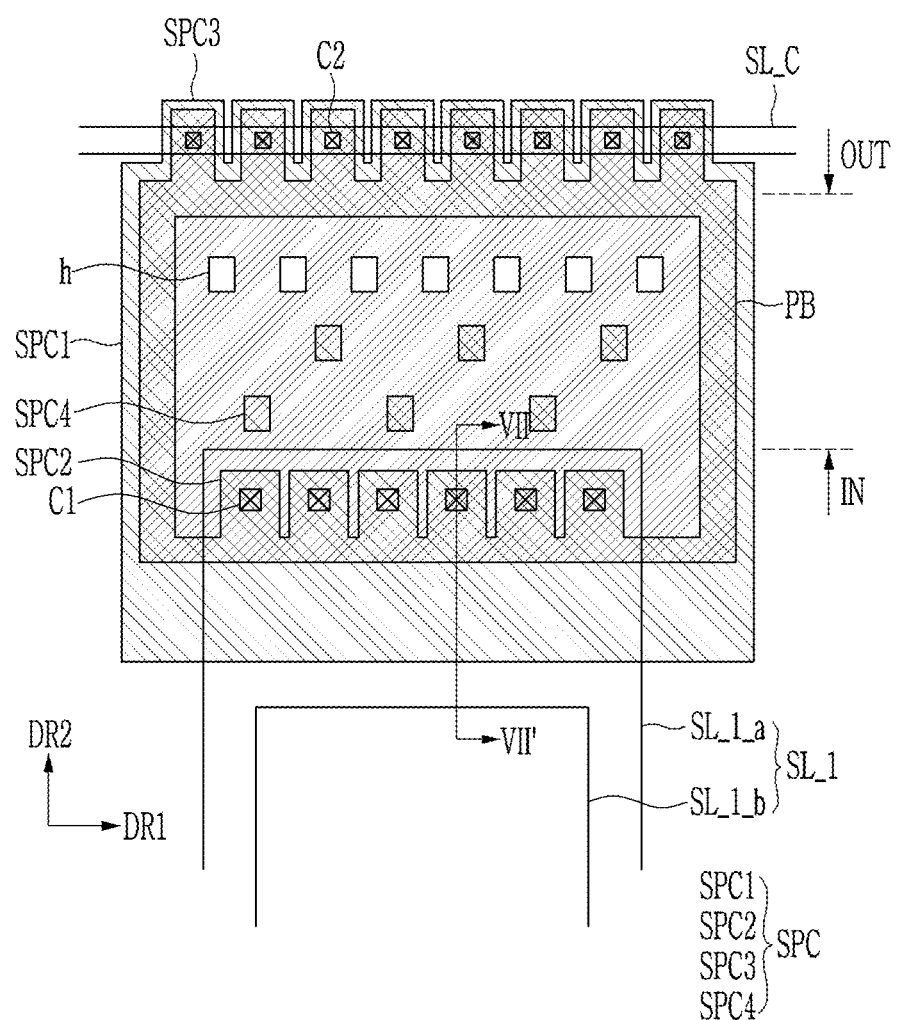
FIG. 6 shows a schematic top plan view of a signal line connecting region according to an embodiment.
Figure 7:
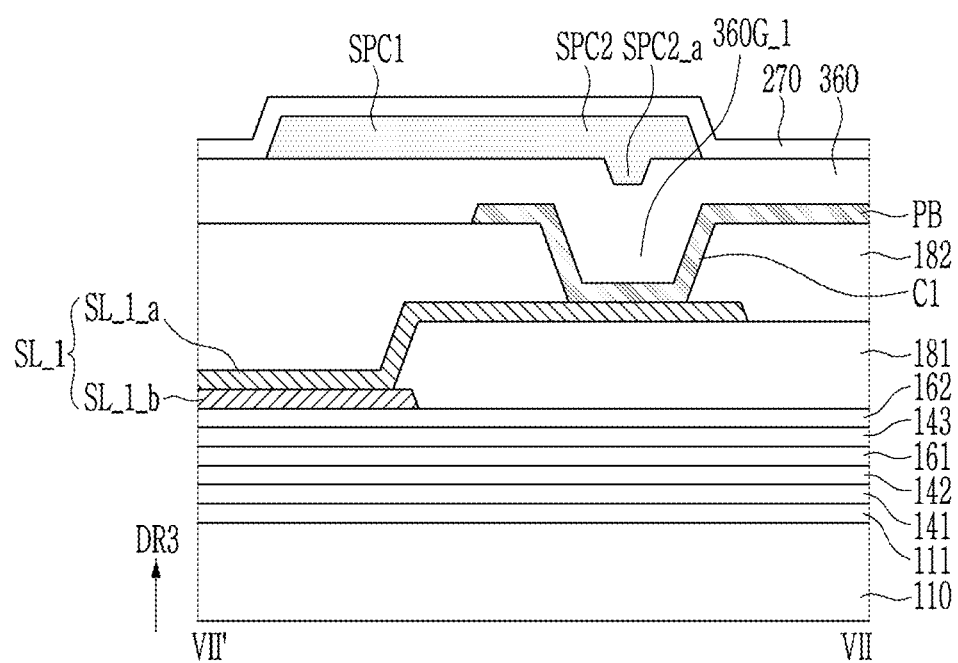
FIG. 7 shows a schematic cross-sectional view with respect to line VII-VII' of FIG. 6.

A display device according to an embodiment will now be described with reference to FIGS. 6 to 9. FIG. 6 illustrates a schematic top plan view of a signal line connecting region according to an embodiment, FIG. 7 illustrates a schematic cross-sectional view taken along line VII-VII' of FIG. 6, and FIGS. 8 and 9 respectively illustrate schematic top plan views of a signal line connecting region according to an embodiment. The same elements as the above-described elements will not be described.

Referring to FIGS. 6 and 7, the spacer SPC positioned in the non-display area NA may be integrally formed according to an embodiment.

As shown in FIGS. 6 and 7, the spacer SPC may have a shape in which the first spacer SPC1 surrounding the edge of the bridge pattern PB, the second spacer SPC2 overlapping the first contact hole C1, and the third spacer SPC3 overlapping the second contact hole C2 are connected or extended to each other.

The second spacer SPC2 may protrude in the second direction DR2 from an internal edge of the first spacer SPC1 in a plan view. The third spacer SPC3 may protrude in the second direction DR2 from an external edge of the first spacer SPC1 in a plan view.

Figure 8:
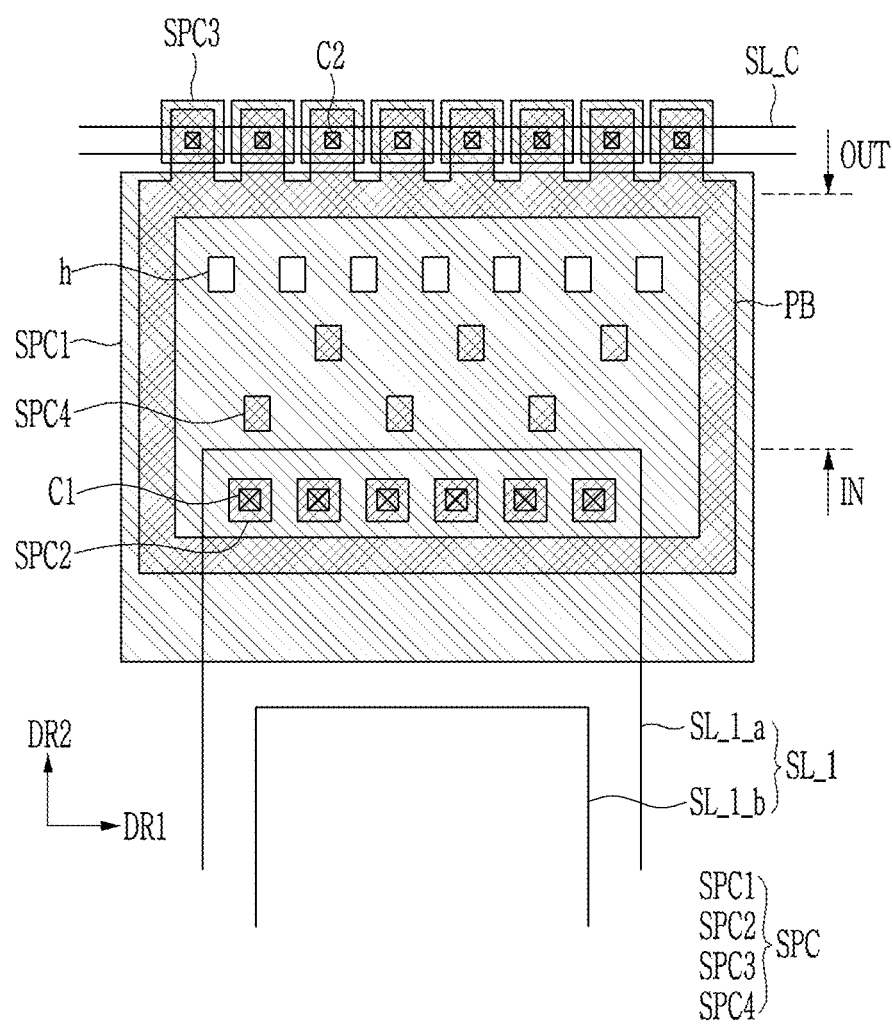
FIG. 8 and FIG. 9 respectively show a schematic top plan view of a signal line connecting region according to an embodiment.

However, the disclosure is not limited thereto. As shown in FIG. 8, the second spacer SPC2 and the third spacer SPC3 may be separated or distanced or spaced apart from the first spacer SPC1. According to an embodiment of FIG. 8, a second spacer SPC2 may overlap a first contact hole C1, and a third spacer SPC3 may overlap a second contact hole C2. The number of second spacers SPC2 may correspond to that of first contact holes C1, and the number of third spacers SPC3 may correspond to that of the second contact holes C2.

Figure 9:
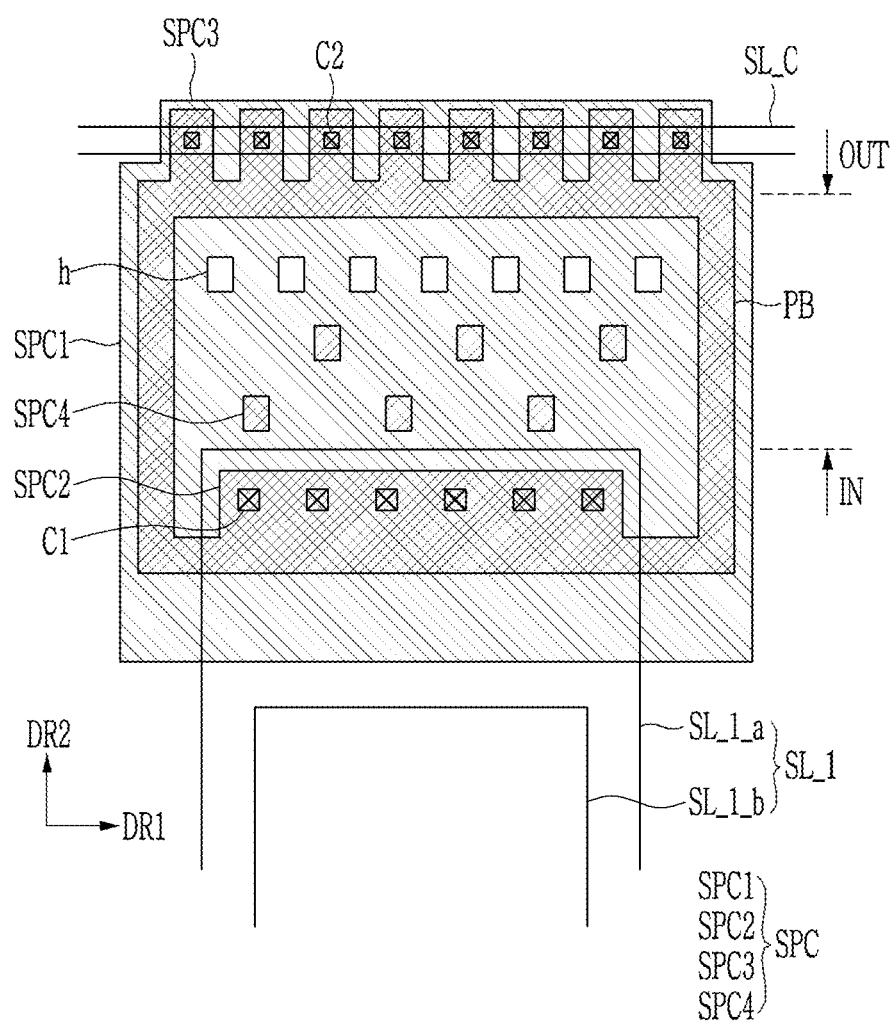

However, the disclosure is not limited thereto. As shown in FIG. 9, a second spacer SPC2 may have a substantially bar shape to overlap first contact holes C1. Likewise, a third spacer SPC3 may have a substantially bar shape to overlap second contact holes C2. The specification illustrates an embodiment in which the second spacer SPC2 and the third spacer SPC3 are connected or extended to the first spacer SPC1 to have a substantially bar shape. However, the disclosure is not limited thereto, and the second spacer SPC2 and the third spacer SPC3 may be separated or distanced or spaced apart from the first spacer SPC1. They may also have shapes according to a combination of the above-described embodiments.

Figure 10:
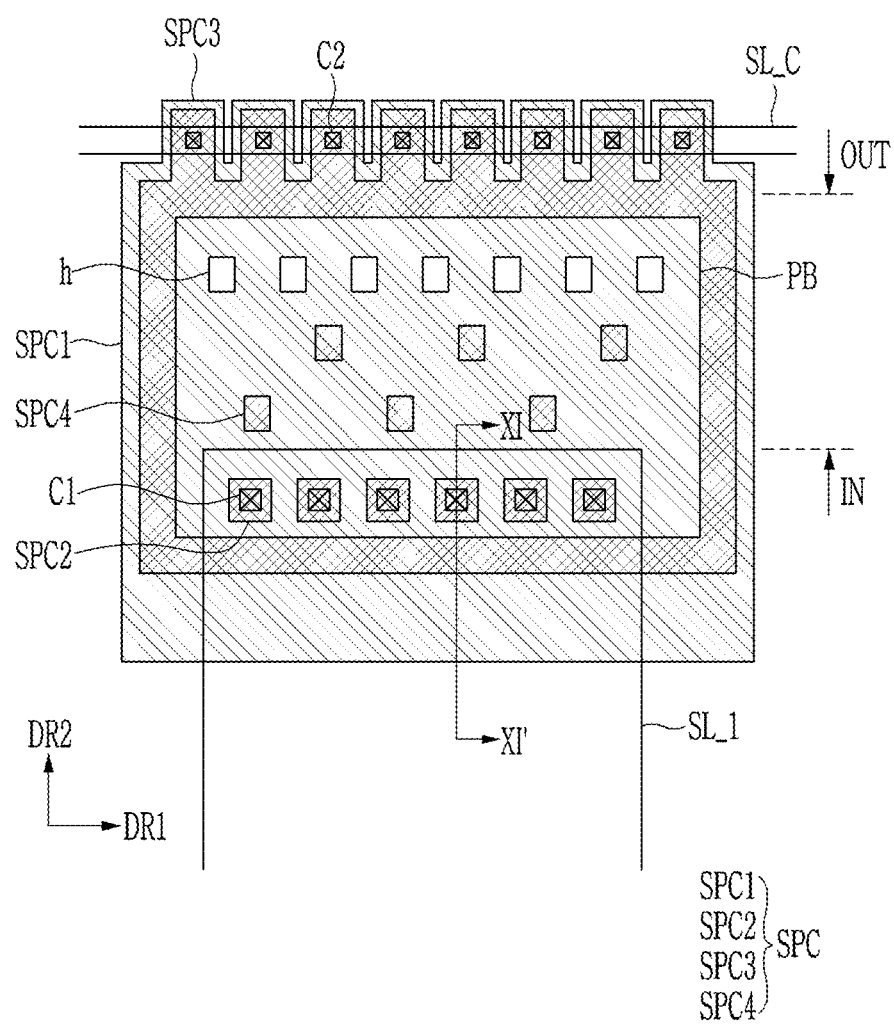
FIG. 10 shows a schematic top plan view of a signal line connecting region according to an embodiment.
Figure 11:
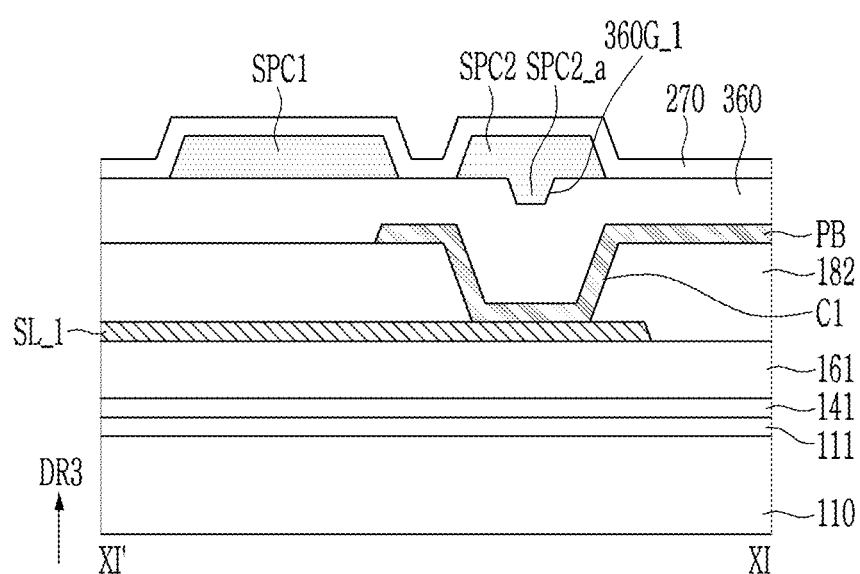
FIG. 11 shows a schematic cross-sectional view with respect to line XI-XI' of FIG. 10.

A connection region according to an embodiment will now be described with reference to FIGS. 10 and 11. FIG. 10 illustrates a schematic top plan view of a signal line connecting region according to an embodiment, and FIG. 11 illustrates a schematic cross-sectional view taken along line XI-XI' of FIG. 10. The same elements as the above-described elements will not be described.

According to an embodiment, the signal line connecting region may have a structure in which a buffer layer 111, a first gate insulating layer 141, and a first insulating layer 161 may be stacked each other on the substrate 110. A first signal line SL_1 may be positioned on the first insulating layer 161. A second insulating layer 162 may be positioned on the first signal line SL1. The second insulating layer 162 may include first contact holes C1 for exposing the first signal line SL_1.

A bridge pattern PB may be positioned on the second insulating layer 162. The bridge pattern PB may be electrically connected to the first signal line SL_1 through the first contact hole C1.

A third insulating layer 360 may be positioned on the bridge pattern PB. The third insulating layer 360 may include a first denting portion 360G_1 positioned in a region thereof overlapping the first contact hole C1.

A spacer SPC may be positioned on the third insulating layer 360. For example, the second spacer SPC2 may overlap the first denting portion 360G_1. The second spacer SPC2 may overlap the first contact hole C1.

According to an embodiment described with reference to FIGS. 10 and 11, the signal line connecting region may have a stacked structure including a simplified insulating layer and a signal wire, compared to the embodiments described with reference to FIGS. 3 to 4B.

Figure 12:
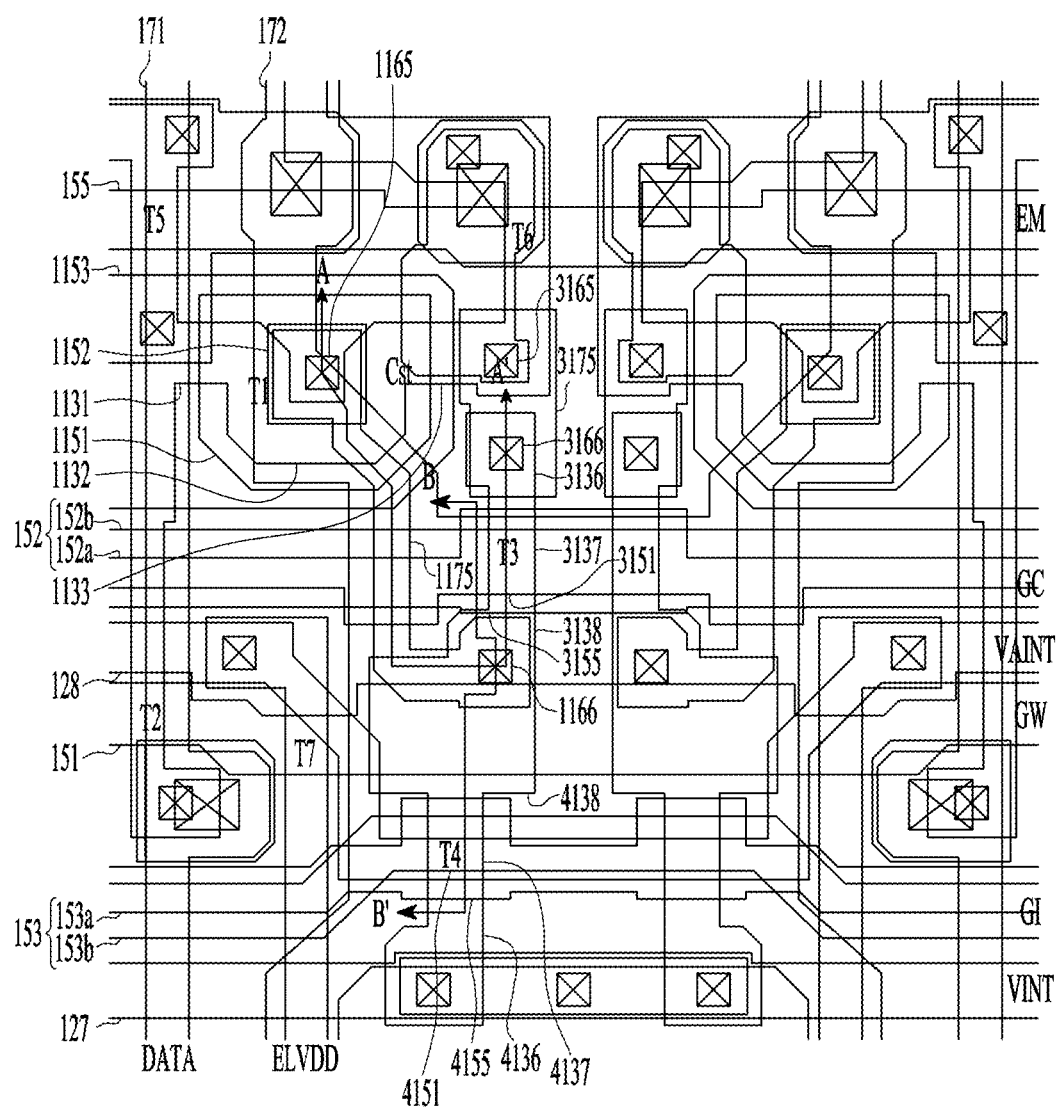
FIG. 12 shows a schematic layout view of a pixel positioned in a display area according to an embodiment.

A pixel PX of a display area DA according to an embodiment will now be described with reference to FIGS. 12 to 14. FIG. 12 illustrates a schematic top plan view of a display device according to an embodiment, FIG. 13 illustrates a schematic cross-sectional view taken along line A-A' of FIG. 12, and FIG. 14 illustrates a schematic cross-sectional view taken along line B-B' of FIG. 12.

Figure 13:
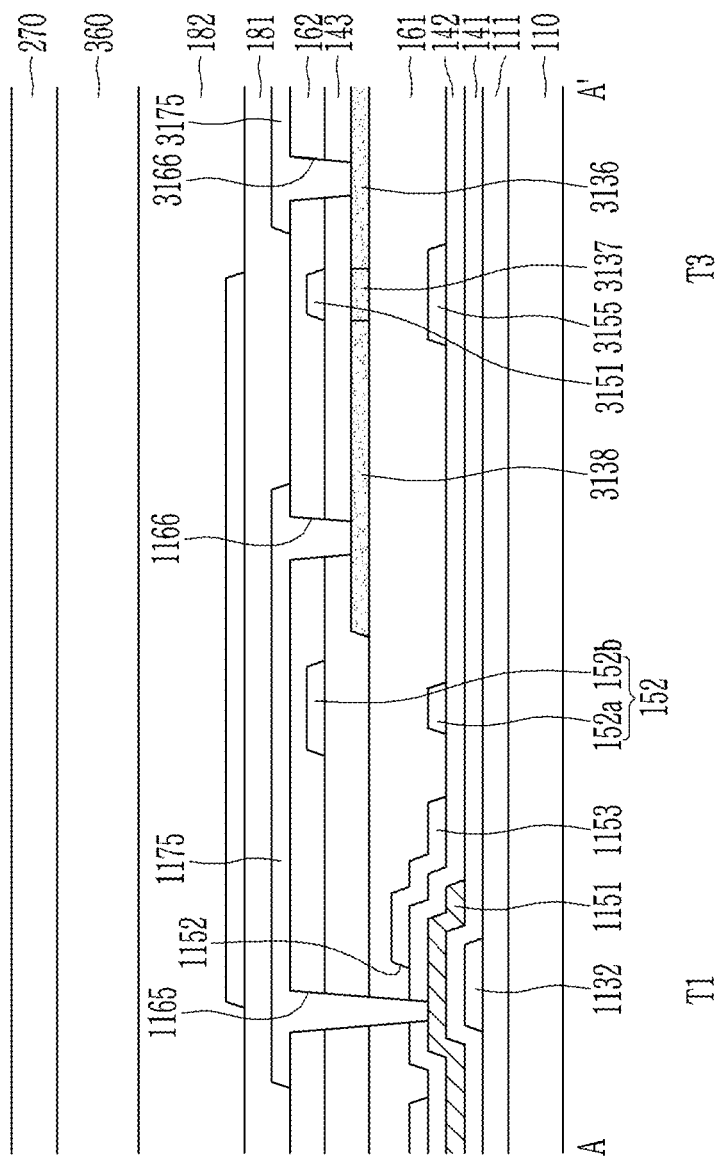
FIG. 13 shows a schematic cross-sectional view with respect to line A-N of FIG. 12.
Figure 14:
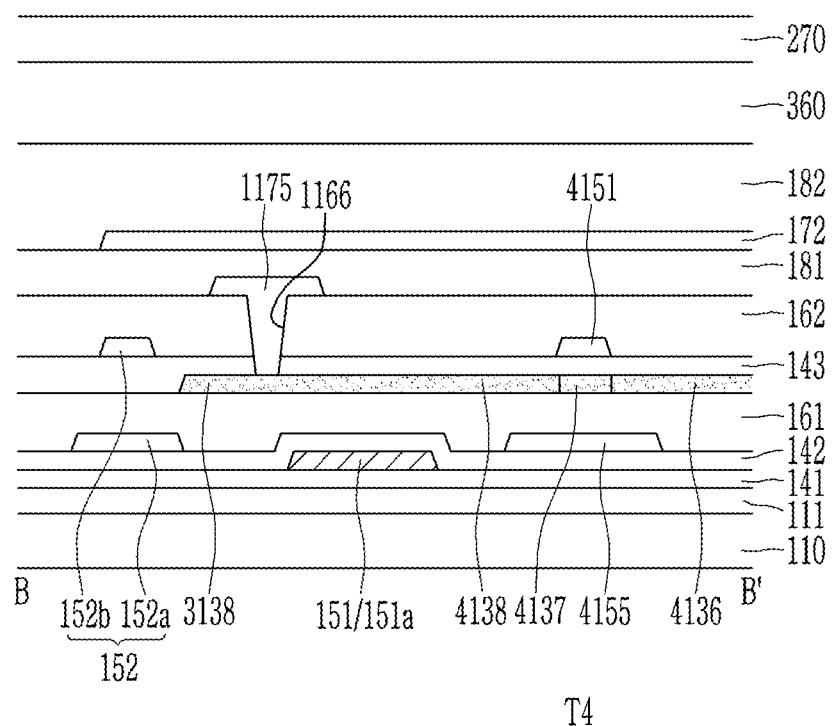
FIG. 14 shows a schematic cross-sectional view with respect to line B-B' of FIG. 12.

Referring to FIGS. 12 to 14 according to an embodiment, a polycrystalline semiconductor including a channel 1132, a first electrode 1131, and a second electrode 1133 of the driving transistor T1 may be positioned on the substrate 110. The polycrystalline semiconductor may further include channels, first electrodes S2, S5, S6, and S7, and second electrodes D2, D5, D6, and D7 of the second transistor T2, the fifth transistor T5, the sixth transistor T6, and the seventh transistor T7 in addition to the driving transistor T1.

The first electrode 1131 and the second electrode 1133 of the driving transistor T1 may be positioned on both sides of the channel 1132 of the driving transistor T1. The first electrode 1131 of the driving transistor T1 may extend upward and downward in a plan view, a portion of the first electrode 1131 extending downward may be electrically connected to the second electrode D2 of the second transistor T2, and a portion of the first electrode 1131 extending upward may be electrically connected to the second electrode D5 of the fifth transistor T5. The second electrode 1133 of the driving transistor T1 may extend upward in a plan view to be electrically connected to the first electrode S6 of the sixth transistor T6.

A buffer layer 111 may be positioned between the substrate 110 and the polycrystalline semiconductor including the channel 1132, the first electrode 1131, and the second electrode 1133 of the driving transistor T1. The buffer layer 111 may have a single or multilayer structure. The buffer layer 111 may include an organic or inorganic insulating material.

A first gate insulating layer 141 may be positioned on the polycrystalline semiconductor including the channel 1132, the first electrode 1131, and the second electrode 1133 of the driving transistor T1

The first gate insulating layer 141 may include a silicon nitride or a silicon oxide.

A first gate conductor including a gate electrode 1151 of the driving transistor T1 may be positioned on a first gate insulating layer 141. The first gate conductor may further include gate electrodes of the second transistor T2, the fifth transistor T5, the sixth transistor T6, and the seventh transistor T7 in addition to the driving transistor T1.

The gate electrode 1151 of the driving transistor T1 may overlap the channel 1132 of the driving transistor T1. The channel 1132 of the driving transistor T1 may be covered or overlapped by the gate electrode 1151 of the driving transistor T1.

The first gate conductor may further include a first scan line 151 and a light emitting control line 155. The first scan line 151 and the light emitting control line 155 may substantially extend in a horizontal direction. The first scan line 151 may be electrically connected to the gate electrode of the seventh transistor T7 positioned on a next-stage pixel PX. For example, a bypass control line electrically connected to the seventh transistor T7 may be formed as a previous-stage first scan line, GW [N−1] 151. The gate electrode of the fifth transistor T5 and the gate electrode of the sixth transistor T6 may be electrically connected to the light emitting control line 155.

The first gate conductor including the gate electrode 1151 of the driving transistor T1 may be formed, and a doping process may be performed. The polycrystalline semiconductor covered or overlapped by the first gate conductor may not be doped, and a portion of the polycrystalline semiconductor not covered or overlapped by the first gate conductor may be doped to have a characteristic identical to that of the conductor. The doping process may be performed with a p-type dopant, and the driving transistor T1, the second transistor T2, the fifth transistor T5, the sixth transistor T6, and the seventh transistor T7 including polycrystalline semiconductors may have a p-type transistor characteristic.

A second gate insulating layer 142 may be positioned on the first gate conductor including the gate electrode 1151 of the driving transistor T1 and on the first gate insulating layer 141. The second gate insulating layer 142 may include a silicon nitride or a silicon oxide.

A second gate conductor including a first storage electrode 1153 of the storage capacitor Cst, a light blocking layer 3155 of the third transistor T3, and a light blocking layer 4155 of the fourth transistor T4 may be positioned on the second gate insulating layer 142.

The first storage electrode 1153 may overlap the gate electrode 1151 of the driving transistor T1 to form the storage capacitor Cst. An opening 1152 may be formed in the first storage electrode 1153 of the storage capacitor Cst. The opening 1152 of the first storage electrode 1153 of the storage capacitor Cst may overlap the gate electrode 1151 of the driving transistor T1. The light blocking layer 3155 of the third transistor T3 may overlap a channel 3137 and a gate electrode 3151 of the third transistor T3. The light blocking layer 4155 of the fourth transistor T4 may overlap a channel 4137 and a gate electrode 4151 of the fourth transistor T4.

The second gate conductor may further include a lower second scan line 152a, a lower initialization control line 153a, and a first initialization voltage line 127. The lower second scan line 152a, the lower initialization control line 153a, and the first initialization voltage line 127 may substantially extend in the horizontal direction. The lower second scan line 152a may be electrically connected to the light blocking layer 3155 of the third transistor T3. The lower second scan line 152a may be integral with the light blocking layer 3155 of the third transistor T3. The lower initialization control line 153a may be electrically connected to the light blocking layer 4155 of the fourth transistor T4. The lower initialization control line 153a may be integral with the light blocking layer 4155 of the fourth transistor T4.

A first insulating layer 161 may be positioned on the second gate conductor including the first storage electrode 1153 of the storage capacitor Cst, the light blocking layer 3155 of the third transistor T3, and the light blocking layer 4155 of the fourth transistor T4. The first insulating layer 161 may include a silicon nitride or a silicon oxide.

An oxide semiconductor, including the channel 3137, a first electrode 3136, and a second electrode 3138 of the third transistor T3 and the channel 4137, a first electrode 4136, and a second electrode 4138 of the fourth transistor T4, may be positioned on the first insulating layer 161.

The first electrode 3136 and the second electrode 3138 of the third transistor T3 may be positioned on both sides of the channel 3137 of the third transistor T3. The first electrode 4136 and the second electrode 4138 of the fourth transistor T4 may be positioned on both sides of the channel 4137 of the fourth transistor T4. The second electrode 3138 of the third transistor T3 may be electrically connected to the second electrode 4138 of the fourth transistor T4.

A third gate insulating layer 143 may be positioned on the oxide semiconductor including the channel 3137, the first electrode 3136, and the second electrode 3138 of the third transistor T3 and the channel 4137, the first electrode 4136, and the second electrode 4138 of the fourth transistor T4. The third gate insulating layer 143 may be positioned on the front sides of the oxide semiconductor and the first insulating layer 161. Therefore, the third gate insulating layer 143 may cover or overlap upper sides and lateral sides of the channel 3137, the first electrode 3136, and the second electrode 3138 of the third transistor T3 and the channel 4137, the first electrode 4136, and the second electrode 4138 of the fourth transistor T4. The embodiment is not limited thereto, and the third gate insulating layer 143 may not be positioned on the front sides of the oxide semiconductor and the first insulating layer 161. For example, the third gate insulating layer 143 may overlap the channel 3137 of the third transistor T3 and may not overlap the first electrode 3136 and the second electrode 3138. The third gate insulating layer 143 may also overlap the channel 4137 of the fourth transistor T4 and may not overlap the first electrode 4136 and the second electrode 4138.

A third gate conductor including the gate electrode 3151 of the third transistor T3 and the gate electrode 4151 of the fourth transistor T4 may be positioned on the third gate insulating layer 143.

The gate electrode 3151 of the third transistor T3 may overlap the channel 3137 of the third transistor T3. The gate electrode 3151 of the third transistor T3 may overlap the light blocking layer 3155 of the third transistor T3.

The gate electrode 4151 of the fourth transistor T4 may overlap the channel 4137 of the fourth transistor T4. The gate electrode 4151 of the fourth transistor T4 may overlap the light blocking layer 4155 of the fourth transistor T4.

The third gate conductor may further include an upper second scan line 152b and an upper initialization control line 153b. The upper second scan line 152b and the upper initialization control line 153b may substantially extend in the horizontal direction. The upper second scan line 152b may form a second scan line 152 together with the lower second scan line 152a. The upper second scan line 152b may be electrically connected to the gate electrode 3151 of the third transistor T3. The upper second scan line 152b may be integral with the gate electrode 3151 of the third transistor T3. The upper initialization control line 153b may form an initialization control line 153 together with the lower initialization control line 153a. The upper initialization control line 153b may be electrically connected to the gate electrode 4151 of the fourth transistor T4. The upper initialization control line 153b may be integral with the gate electrode 4151 of the fourth transistor T4.

The third gate conductor including the gate electrode 3151 of the third transistor T3 and the gate electrode 4151 of the fourth transistor T4 may be formed, and a doping process may be performed. A portion of the oxide semiconductor covered or overlapped by the third gate conductor may not be doped, and a portion of the oxide semiconductor not covered or overlapped by the third gate conductor may be doped, and thus the oxide semiconductor may have a characteristic identical to that of the conductor. The channel 3137 of the third transistor T3 may be positioned below the gate electrode 3151 to overlap the gate electrode 3151. The first electrode 3136 and the second electrode 3138 of the third transistor T3 may not overlap the gate electrode 3151. The channel 4137 of the fourth transistor T4 may be positioned below the gate electrode 4151 to overlap the gate electrode 4151. The first electrode 4136 and the second electrode 4138 of the fourth transistor T4 may not overlap the gate electrode 4151. The doping process for the oxide semiconductor may be performed with an n-type dopant, and the third transistor T3 and the fourth transistor T4 including oxide semiconductors may have an n-type transistor characteristic.

A second insulating layer 162 may be positioned on the third gate conductor including the gate electrode 3151 of the third transistor T3 and the gate electrode 4151 of the fourth transistor T4. The second insulating layer 162 may include a first opening 1165, a second opening 1166, a third opening 3165, and a fourth opening 3166.

The first opening 1165 may overlap at least a part of the gate electrode 1151 of the driving transistor T1. The first opening 1165 may further be formed in the third gate insulating layer 143, the first insulating layer 161, and the second gate insulating layer 142. The first opening 1165 may overlap the opening 1152 of the first storage electrode 1153. The first opening 1165 may be positioned in the opening 1152 of the first storage electrode 1153.

The third opening 3165 may overlap at least a part of the second electrode 1133 of the driving transistor T1. The third opening 3165 may further be formed in the third gate insulating layer 143, the first insulating layer 161, the second gate insulating layer 142, and the first gate insulating layer 141. The fourth opening 3166 may overlap at least a part of the first electrode 3136 of the third transistor T3. The fourth opening 3166 may further be formed in the third gate insulating layer 143.

A first data conductor including a first connection electrode 1175 and a second connection electrode 3175 may be positioned on the second insulating layer 162. The first connection electrode 1175 may overlap the gate electrode 1151 of the driving transistor T1. The first connection electrode 1175 may be electrically connected to the gate electrode 1151 of the driving transistor T1 through the first opening 1165 and the opening 1152 of the first storage electrode 1153. The first connection electrode 1175 may overlap the second electrode 3138 of the third transistor T3. The first connection electrode 1175 may be electrically connected to the second electrode 3138 of the third transistor T3 through the second opening 1166. Therefore, the gate electrode 1151 of the driving transistor T1 may be electrically connected to the second electrode 3138 of the third transistor T3 by the first connection electrode 1175.

The second connection electrode 3175 may overlap the second electrode 1133 of the driving transistor T1. The second connection electrode 3175 may be electrically connected to the second electrode 1133 of the driving transistor T1 through the third opening 3165. The second connection electrode 3175 may overlap the first electrode 3136 of the third transistor T3. The second connection electrode 3175 may be electrically connected to the first electrode 3136 of the third transistor T3 through the fourth opening 3166. Therefore, the second electrode 1133 of the driving transistor T1 may be electrically connected to the first electrode 3136 of the third transistor T3 by the second connection electrode 3175.

The first data conductor may further include a second initialization voltage line 128. The second initialization voltage line 128 may substantially extend in the horizontal direction.

A third insulating layer 181 may be positioned on the first data conductor including the first connection electrode 1175 and the second connection electrode 3175.

A data line 171 and a driving voltage line 172 may be positioned on the third insulating layer 181. The data line 171 and the driving voltage line 172 may substantially extend in perpendicular or vertical directions. The data line 171 may be electrically connected to the second transistor T2. The driving voltage line 172 may be electrically connected to the fifth transistor T5. The driving voltage line 172 may be electrically connected to the first storage electrode 1153.

A fourth insulating layer 182 may be positioned on the data line 171 and the driving voltage line 172, and an anode (not shown) may be positioned on the fourth insulating layer 182. The anode may be electrically connected to the sixth transistor T6 and may receive a current output by the driving transistor T1. A partition wall 360 may be positioned on the anode. An opening may be formed in the partition wall 360, and the opening of the partition wall 360 may overlap the anode. A light-emitting device layer may be positioned in the opening. A cathode 270 may be positioned on the light-emitting device layer and the partition wall 360. The anode, the light-emitting device layer, and the cathode 270 may constitute a light-emitting diode LED.

According to the specification, the first initialization voltage line 127 and the second gate conductor may be positioned on a same layer, and the second initialization voltage line 128 and the first data conductor may be positioned on a same layer. However, the disclosure is not limited thereto, and the first initialization voltage line 127 and the second initialization voltage line 128 may be positioned on other layers according to arrangement of elements.

The first initialization voltage line 127 and the second initialization voltage line 128 described with reference to FIGS. 12 to 14 may be the above-described connection wires SL_C or may be signal lines electrically connected to the connection wire SL_C.

Figure 15:
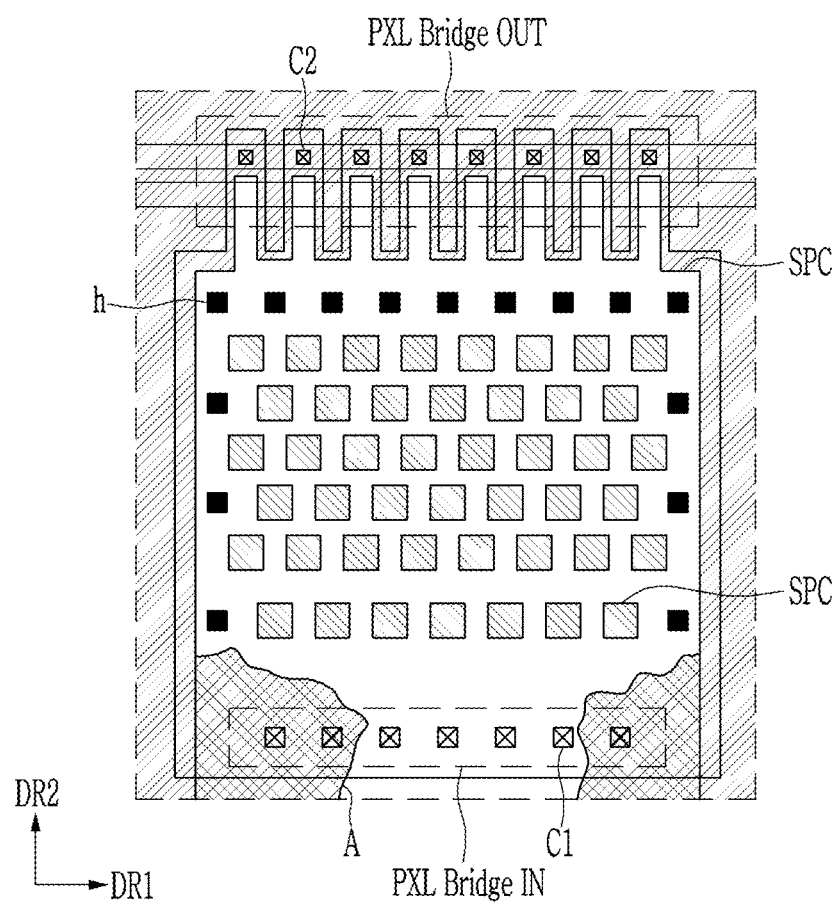
FIG. 15 shows a schematic diagram of an image in a connecting region according to an embodiment and a comparative example.

A comparative example and an example will now be described with reference to FIGS. 15 and 16. FIG. 15 illustrates a schematic top plan view of a connecting region according to an example and a comparative example, and FIG. 16 illustrates an image of a spacer having a height according to an example.

Referring to FIG. 15, the region in which the first contact hole C1 connected or extended to the signal wire positioned or disposed in the non-display area NA is positioned or disposed is marked as a PXL Bridge IN, and the region in which the connection wire electrically connected to the display area DA and the second contact hole C2 are positioned is marked as a PXL Bridge OUT. The region of PXL Bridge IN corresponds to the comparative example in which no spacer overlapping the first contact hole C1 is positioned, and the region of PXL Bridge OUT corresponds to the embodiment in which a spacer SPC overlapping the second contact hole C2 is positioned.

Referring to FIG. 15, it is found in the region of the PXL Bridge IN that the insulating layer includes a denting portion by an absence of the spacer SPC, and defects A occur as the conductive layer and the bridge pattern formed along the denting portion are burnt. However, it is found in the region of PXL Bridge OUT according to an embodiment that the spacer SPC overlapping the second contact hole C2 fills the denting portion of the insulating layer and provides a planar or flat upper side, thereby preventing the conductive layer and the bridge pattern positioned on the upper side of the spacer SPC from being short circuited or burnt.

Figure 16:
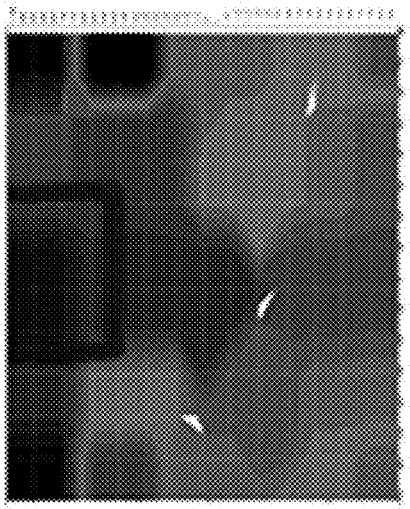
FIG. 16 shows an image of a height of a spacer and a table of heights of spacers at which defects may occur and may not occur according to an embodiment.

FIG. 16 illustrates a simulation image for which whether defects have occurred according to changes in heights of the second spacer and the third spacer have been confirmed. The numbers listed on a table on the right of FIG. 16 indicate heights of the spacers in units of angstroms (Å). The numbers indicating the heights at which defects have occurred (for example, being short circuited or burnt) appear less than about 10,000 angstroms (Å), and the numbers equal to or greater than about 10,000 angstroms (Å) represent the heights at which no defects have occurred. It is found based on the simulation result of the table that the spacer having a height equal to or greater than about 10,000 angstroms (Å) is efficient in preventing the conductive layer and the bridge pattern from being short circuited or burnt.

While this disclosure has been described in connection with what is considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A display device comprising:
    a display panel including a display area and a non-display area;
    a first signal line disposed in the non-display area and transmitting an initialization voltage;
    a connection wire disposed in the non-display area and electrically connected to the first signal line;
    a bridge pattern electrically connecting the first signal line to the connection wire;
    an insulating layer disposed between the first signal line and the bridge pattern;
    a partition wall disposed on the bridge pattern;
    a spacer disposed on the partition wall; and
    a conductive layer disposed on the spacer in the non-display area, wherein
    the insulating layer includes:
        a first contact hole overlapping the first signal line; and
        a second contact hole overlapping the connection wire,
    the first signal line is electrically connected to the bridge pattern through the first contact hole,
    the bridge pattern is electrically connected to the connection wire through the second contact hole,
    the partition wall covers the first contact hole,
    the spacer overlaps the first contact hole, and
    the conductive layer protrudes on the spacer in a direction away from the substrate in a cross-sectional view.

2. The display device of claim 1, wherein
    the partition wall fills the first contact hole and the second contact hole, and
    the partition wall includes:
        a first denting portion overlapping the first contact hole, and
        a second denting portion overlapping the second contact hole.

3. The display device of claim 2, wherein the spacer fills the first denting portion and the second denting portion of the partition wall.

4. The display device of claim 1, wherein
    the partition wall and the spacer are disposed on a same layer and include a same material, and
    the spacer protrudes from the partition wall.

5. The display device of claim 1, wherein the spacer includes:
    a first spacer surrounding an edge of the bridge pattern;
    a second spacer overlapping the first contact hole; and
    a third spacer overlapping the second contact hole.

6. The display device of claim 5, wherein the spacer further includes a fourth spacer disposed on the bridge pattern and not overlapping the first contact hole and the second contact hole.

7. The display device of claim 5, wherein the second spacer is spaced apart from the first spacer.

8. The display device of claim 5, wherein the second spacer is connected to the first spacer.

9. The display device of claim 5, wherein the third spacer is spaced apart from the first spacer.

10. The display device of claim 5, wherein the third spacer is connected to the first spacer.

11. The display device of claim 1, wherein
    the display panel includes a buffer layer, a first gate insulating layer, a second gate insulating layer, a first insulating layer, a third gate insulating layer, a second insulating layer, a third insulating layer, a fourth insulating layer, and the partition wall sequentially disposed on a substrate, and
    the first signal line and the connection wire are disposed between the third insulating layer and the fourth insulating layer.

12. The display device of claim 11, wherein the bridge pattern is disposed between the fourth insulating layer and the partition wall.

13. The display device of claim 11, wherein
    the spacer is disposed on the partition wall, and
    the display device further includes a conductive layer disposed on the spacer.

14. The display device of claim 1, wherein a height of the spacer is equal to or greater than about 10,000 angstroms (Å).

15. A display device comprising:
    a display panel including a display area and a non-display area;
    a first signal line disposed in the non-display area and transmitting a first signal;
    a connection wire electrically connected to the first signal line;
    a bridge pattern disposed in the non-display area and electrically connecting the first signal line to the connection wire;
    an insulating layer disposed between the first signal line and the bridge pattern;
    a partition wall disposed on the bridge pattern;
    a spacer disposed on the partition wall; and
    a conductive layer disposed on the spacer in the non-display area,
    wherein
    the insulating layer includes:
        a first contact hole overlapping the first signal line; and
        a second contact hole overlapping the connection wire,
    the first signal line is electrically connected to the bridge pattern through the first contact hole, the bridge pattern is electrically connected to the connection wire through the second contact hole, the partition wall includes a denting portion overlapping the first contact hole and the second contact hole, and the spacer fills the denting portion, the conductive layer protrudes on the spacer in a direction away from the substrate in a cross-sectional view.

16. The display device of claim 15, wherein the first signal line transmits a first initialization voltage or a second initialization voltage.

17. The display device of claim 15, wherein the bridge pattern includes at least an opening in the bridge pattern.

18. The display device of claim 15, wherein
the connection wire extends in a first direction,
the first signal line extends in a second direction, and
the first direction and the second direction are substantially perpendicular to each other.

19. The display device of claim 15, wherein the spacer includes:
a first spacer surrounding an edge of the bridge pattern,
a second spacer overlapping the first contact hole, and
a third spacer overlapping the second contact hole.

20. The display device of claim 19, wherein the spacer further includes a fourth spacer disposed on the bridge pattern and not overlapping the first contact hole and the second contact hole.

21. The display device of claim 1, wherein the conductive layer protrudes on the spacer at an area overlapping the first contact hole.

* * * * *